(12) United States Patent
Kwan et al.

(10) Patent No.: US 7,692,881 B2
(45) Date of Patent: Apr. 6, 2010

(54) STRUCTURE FOR USE IN A PROJECTION EXPOSURE SYSTEM FOR MANUFACTURING SEMICONDUCTORS

(75) Inventors: Yim-Bun Patrick Kwan, Aalen (DE); Bernhard Geuppert, Aalen (DE); Nico Kemper, Eindhoven (NL)

(73) Assignees: Carl Zeiss SMT AG (DE); ASML Netherlands B.V. (NL)

( * ) Notice: Subject to any disclaimer, the term of this patent is extended or adjusted under 35 U.S.C. 154(b) by 306 days.

(21) Appl. No.: 10/597,872

(22) PCT Filed: Feb. 22, 2005

(86) PCT No.: PCT/EP2005/001826

§ 371 (c)(1),
(2), (4) Date: Mar. 28, 2007

(87) PCT Pub. No.: WO2005/081029

PCT Pub. Date: Sep. 1, 2005

(65) Prior Publication Data

US 2007/0165311 A1    Jul. 19, 2007

(30) Foreign Application Priority Data

Feb. 25, 2004   (DE) .................. 10 2004 009 203

(51) Int. Cl.
*G02B 7/02* (2006.01)
(52) U.S. Cl. ...................... 359/811; 359/819

(58) Field of Classification Search .............. None
See application file for complete search history.

(56) References Cited

U.S. PATENT DOCUMENTS

| | | | |
|---|---|---|---|
| 6,825,998 B2 * | 11/2004 | Yoshida | 359/819 |
| 2003/0162484 A1 | 8/2003 | Oshino | |
| 2003/0234918 A1 * | 12/2003 | Watson | 355/53 |
| 2008/0002170 A1 * | 1/2008 | Gellrich et al. | 355/55 |

FOREIGN PATENT DOCUMENTS

| | | |
|---|---|---|
| EP | 1 278 089 A2 | 1/2003 |
| EP | 1 338 911 A2 | 8/2003 |
| JP | 660-122911 U | 8/1985 |

* cited by examiner

*Primary Examiner*—Jordan M. Schwartz
*Assistant Examiner*—James C Jones
(74) *Attorney, Agent, or Firm*—GrayRobinson, PA

(57) ABSTRACT

A structure for mounting an assembly of optical elements disposed within a housing, in particular of a projection lens assembly of a projection exposure system for manufacturing semiconductor elements includes a plurality of supporting elements, each respective one of which forms part of a respective one of a plurality of connections though which the housing of the assembly is connected to said supporting structure through which the weight of the assembly is transferred to the supporting structure in such a way that supporting forces generated by said supporting structure are taken up by pressure forces and shear forces which act on at least one of the supporting elements.

18 Claims, 5 Drawing Sheets

STRUCTURE FOR USE IN A PROJECTION EXPOSURE SYSTEM FOR MANUFACTURING SEMICONDUCTORS

CROSS-REFERENCE TO RELATED APPLICATIONS

This is a U.S. National Phase Entry under 35 U.S.C. §371 of International Application No. PCT/EP2005/001826 filed Feb. 22, 2005 and claims priority to German Patent Application No. 10 2004 0009 203.6 filed Feb. 2, 2004.

BACKGROUND OF THE INVENTION

1. Field of the Invention

The invention relates to a housing structure for mounting optical elements, in particular of a projection lens housing in a projection exposure system for manufacturing semiconductor elements, attachment locations, which have connecting parts, for connection to a supporting structure being provided on structural elements.

2. Description of the Related Art

A housing structure of the kind mentioned in the introduction is described in EP 1 278 089 A2. The housing structure constitutes, in a projection exposure system, the housing of a projection lens, in which a plurality of optical elements, such as, for example, lens elements and mirrors, are mounted. The housing structure or projection lens housing is provided with attachment locations on structural elements, at which, via connecting elements, the housing structure is supported with its weight on a supporting structure of the projection exposure system since the housing structure is suspended into the system. In this connection, the attachment locations are also to be provided in such a way that kinematically defined mounting is brought about, exchangeability also having to be ensured.

For various reasons, the housing structure is, in particular in projection exposure systems in the EUV range, made from a glass ceramic structure, On the other hand, the supporting structure of the projection exposure system is made from a different material, in general from a metal material. This means that the connection between the housing structure and the supporting structure is problematic owing to the different materials, in particular with regard to stability, thermal expansion coefficient and temperature differences.

For further prior art, reference is made to US 2003/0162484 A1 and EP 1 338 911 A2.

SUMMARY OF THE INVENTION

The object of the present invention is to produce a housing structure with attachment locations for connection to a supporting structure, the attachment eliminating the disadvantages or problems indicated above, in particular by means of which a stable, easily separable connection is brought about, it being possible for the great associated forces arising to be dissipated without major constructional outlay.

According to the invention, this object is achieved by virtue of the fact that supporting elements, which are provided with mounting flanges for connection to the supporting structure, act on the structural elements in such a way that supporting forces, in particular weight forces, are taken up essentially by pressure forces and shear forces.

Owing to the construction and the support of the housing structure or lens housing, torques also arise in addition to tensile stresses and compressive stresses, which torques are based inter alia on the fact that different points of action exist between the attachment locations or flange connections between the housing structure and the supporting structure and the weight force component.

By means of the supporting elements according to the invention, torques which lead to stresses and bending are to a great extent avoided, so that the imaging quality of the optical system is not impaired.

If according to the invention the supporting elements are designed in such a way that essentially only shear forces and pressure forces arise, connections can be made in a relatively simple way by means of adhesive surfaces. This constitutes both a simple and a secure type of connection for the intended application. This is true in particular if, in one configuration according to the invention, the housing structure consists at least in part of glass ceramic with structural elements made of glass ceramic and the supporting structure consists of metal. In this case, the supporting elements will also be made from a metal material and an adhesive connection will accordingly be made between the structural elements and the supporting elements.

A constructional design according to the invention of a supporting element can consist in that the supporting elements each have at least approximately an L-shape with a mounting flange.

Instead of an L-shape, it is also possible to configure a supporting element in such a way that the supporting elements each have a U-shape seen in cross section, from which the mounting flange branches off, the associated structural element being received between the two U-legs.

A further configuration according to the invention can consist in that the supporting element has two clamping plates arranged at a distance from one another, between which the associated structural element is received, a shear plate running parallel to the outer wall of the structural element, and a mounting flange connected to the two clamping plates and the shear plate.

Advantageous developments and configurations emerge from the other subclaims and from the illustrative embodiment described in principle below with reference to the drawings.

DETAILED DESCRIPTION

Figure 1:
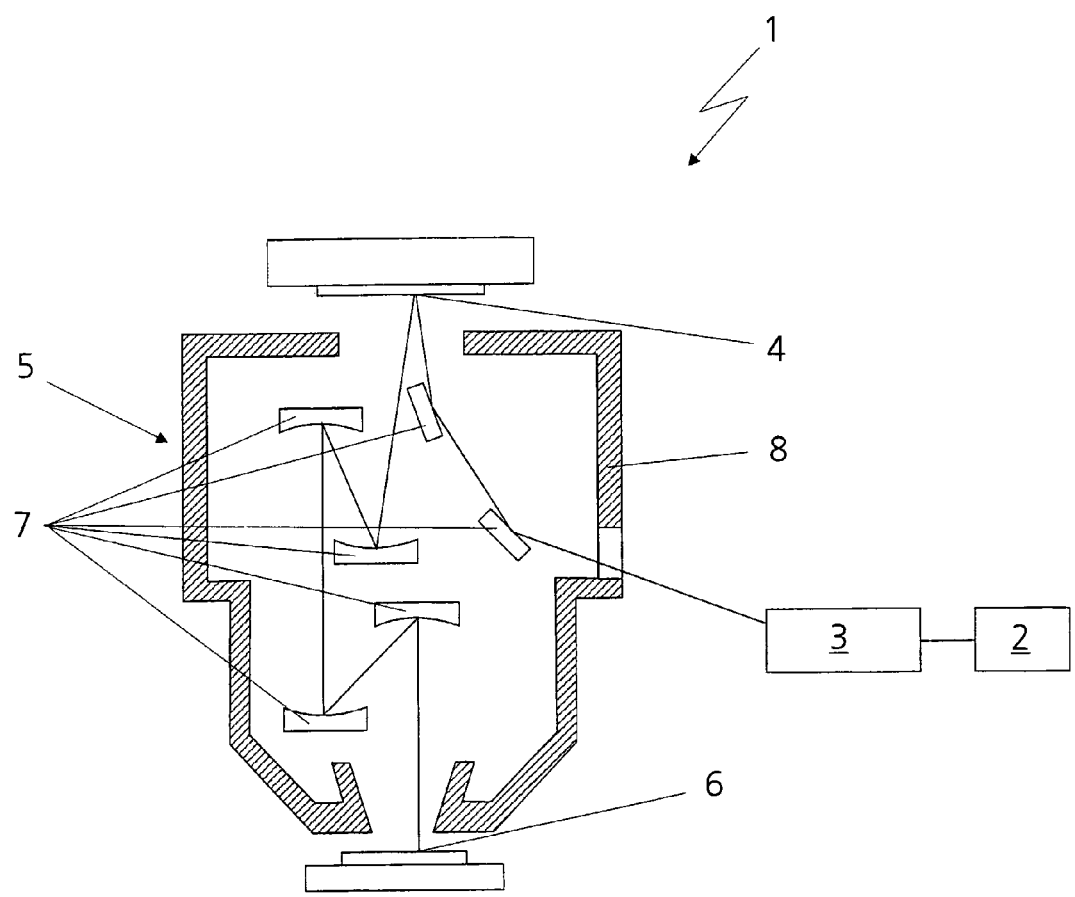
FIG. 1 shows a diagrammatic illustration of a projection exposure system with a projection lens.

As can be seen from FIG. 1, an EUV projection exposure system 1 has a light source 2, an EUV illumination system 3 for illuminating a field in a plane 4 in which a structure-bearing mask is arranged, and a projection lens 5 for imaging the structure-bearing mask in the plane 4 onto a light-sensitive substrate 6. The projection lens 5 has a number of optical elements, in particular mirrors 7, in a lens housing 8.

Figure 2:
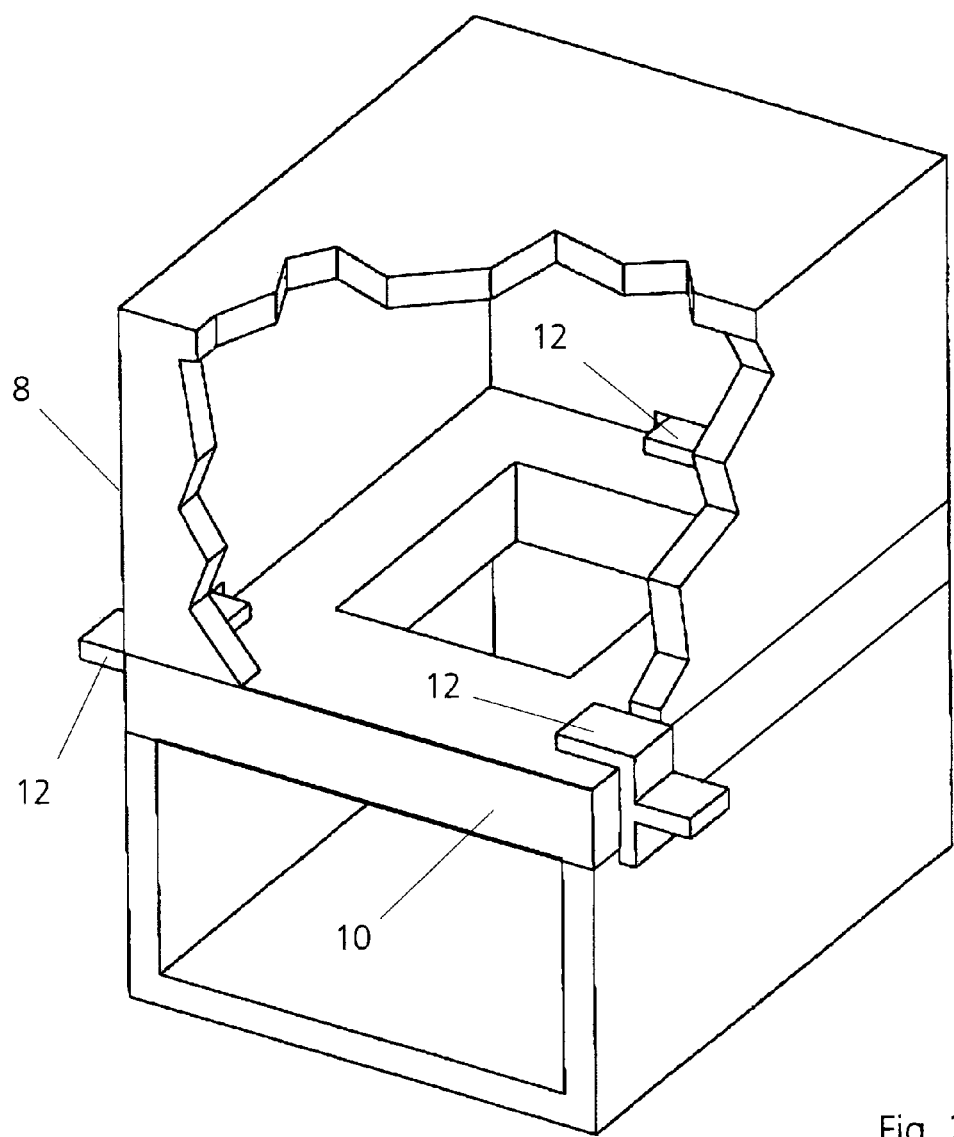
FIG. 2 shows the projection lens as a housing structure according to FIG. 1.
Figure 3:
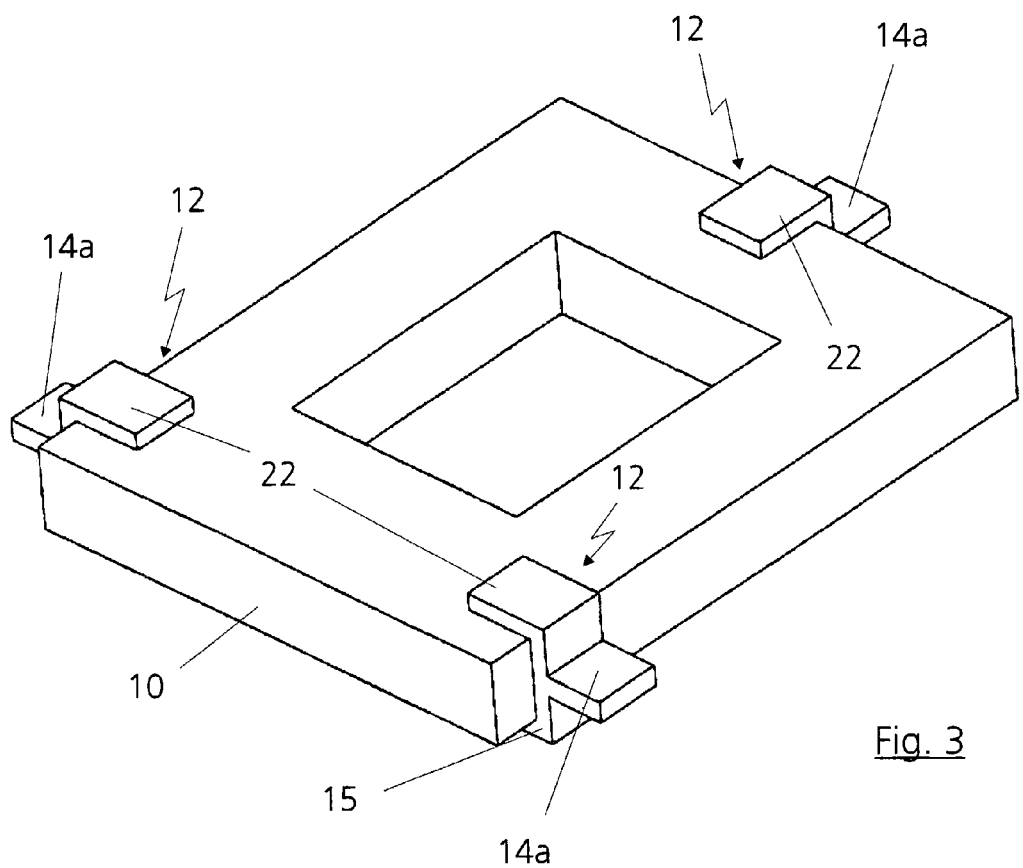
FIG. 3 shows a structural plate of the housing structure according to FIG. 2.

In FIGS. 2 and 3, the lens housing 8 is in each case illustrated in a simple configuration in an enlarged perspective view.

The lens housing 8 designed as a housing structure has a plurality of structural elements 9 in the form of support struts and support plates. Arranged in the central region is a structure reinforcement plate 10 running transversely to the optical axis, which interconnects the individual structural elements to form a stable unit. For clearer illustration of the structure reinforcement plate 10 illustrated in FIG. 3 and its connection to the structural elements 9, the structural elements lying at the front in the drawing are omitted in FIG. 2.

The attachment or suspension of the lens housing 8 via attachment locations to or on a supporting structure 11 of the projection exposure system 1 is effected by means of the structure reinforcement plate 10. The supporting structure 11 is indicated only in part in FIGS. 4 to 7.

FIGS. 4 to 7 illustrate various embodiments for the configuration of attachment locations with supporting elements 12 for connection to the supporting structure. As can be seen from FIG. 3, three supporting elements 12 arranged at a distance from one another are provided on the structure reinforcement plate 10, as the structural element, by means of which supporting elements a kinematically defined connection to the supporting structure 11 can be made. The structural elements, namely the structural struts and side plates 9 and the transversely running structure reinforcement plate 10, are in general made of glass, ceramic or glass ceramic material, for example Zerodur. Each supporting element 12 has a mounting flange 13, which is made of a metal material and is connected, in a way not illustrated further, to the supporting structure, which in general is likewise made of a metal material. Screw connections, for example, can be provided for this purpose.

Owing to the different materials of mounting flange 13 and structural elements 9 and 10, a connection of these two parts is to be ensured which is designed in such a way that problems do not arise owing to different thermal expansion coefficients when temperature differences occur. Moreover, attention is to be paid to the fact that with glass ceramic, for example, connection techniques likewise give rise to problems. This applies, for example, to the introduction of stresses, which can moreover have a negative effect on the imaging quality of the projection lens 5.

Figure 4:
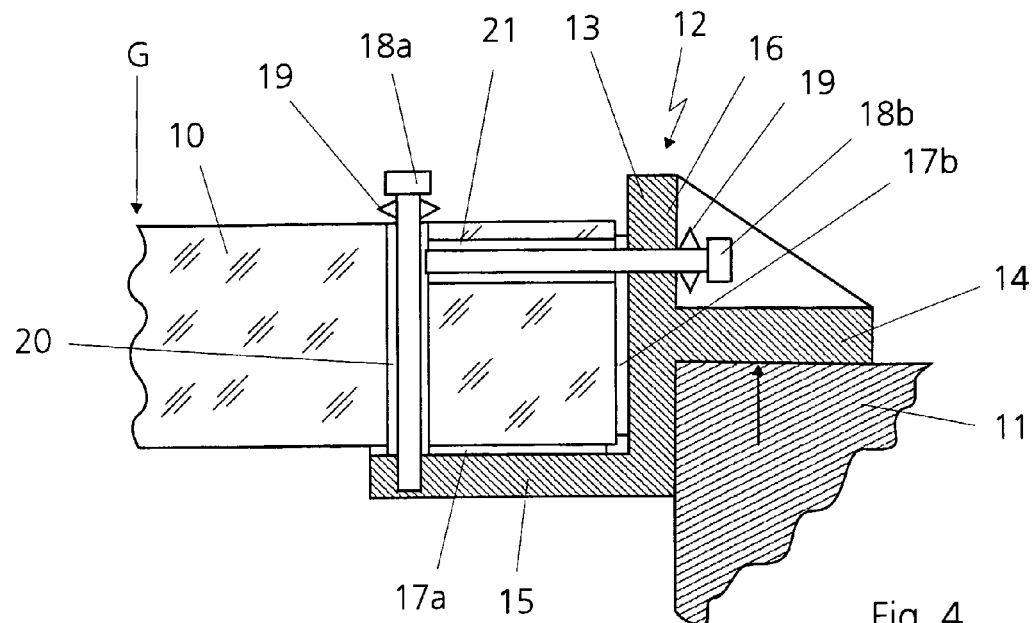
FIG. 4 shows an enlarged illustration of an attachment location with a supporting element in a first configuration.

The illustrative embodiment according to FIG. 4 shows a supporting element 12 with a mounting flange 13 in an L-shape, to which a mounting plate 14 for connection to the supporting structure 11 is attached.

In the case of a vertical arrangement of the lens housing 8, the horizontal part of the L-shape constitutes a support plate 15 for the structure reinforcement plate 10. The vertical part of the L-shape constitutes a peripheral plate 16, to the outer side of which the mounting plate 14 is attached. The mounting flange 13 can be of one-piece design. An adhesive layer 17a and 17b is in each case introduced over the entire area between the support plate 15 and the structure reinforcement plate 10 and between the peripheral plate 16 and the structure reinforcement plate 10. The connection between the structure reinforcement plate 10 and the supporting structure 11 is effected by means of the two adhesive layers 17a and 17b. Pressure forces due to the weight force of the lens housing 8 and at the same time shear forces as well act on the adhesive surface of the adhesive layer 17a. Only shear forces act on the vertically arranged adhesive layer 17b.

As the supporting forces illustrated by an arrow act outside the weight force G of the lens housing 8, and owing to the type of mounting illustrated, torque forces would also arise in addition. In order that only pressure forces and shear forces arise, and in order that there are no inadmissible stress peaks in the adhesive layers 17a and 17b, bolts or screws 18a and 18b are additionally provided, which are prestressed by spring elements 19. The screw 18a extends in the vertical direction through a through-bore 20 in the structure reinforcement plate 10 and is screwed into the support plate 15, while the head of the screw lies on the upper side of the structure reinforcement plate 10 under prestress.

The screw 18b is passed through a horizontal bore in the peripheral plate 16 and screwed into a horizontal metal threaded bush 21, which is glued into the structure reinforcement plate 10. The head of the screw 18b lies under the prestress of the spring element 19 on that side of the peripheral plate 16 facing away from the structure reinforcement plate 10.

Figure 5:
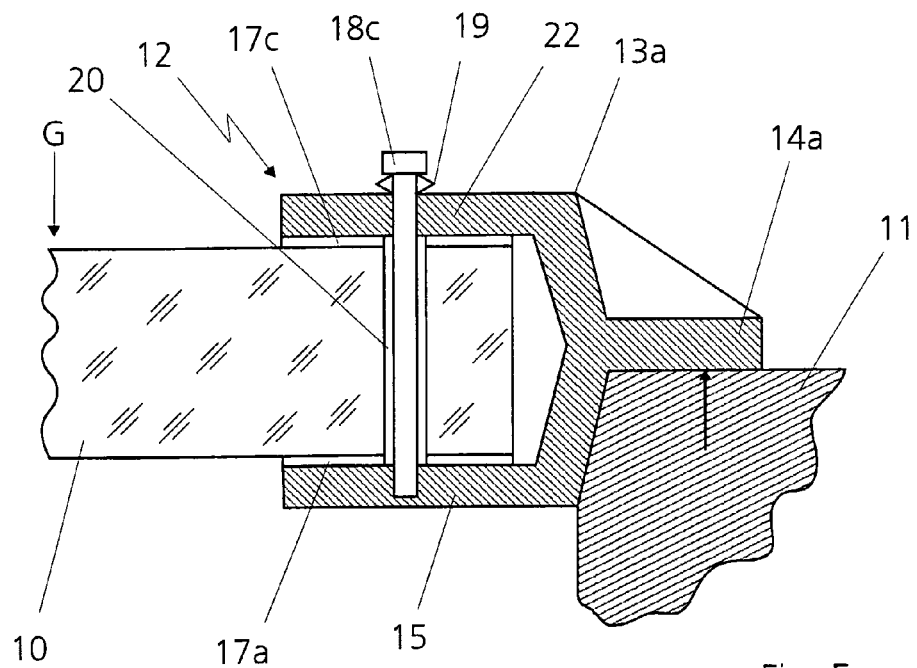
FIG. 5 shows an enlarged illustration of an attachment location with a supporting element in a second configuration.

FIG. 5 illustrates a configuration of the supporting element 12 which has a U-profile shape 13a, with a lower support plate 15 and an upper clamping plate 22, the support plate 15 and the clamping plate 22 forming the two legs of the U-profile shape. The mounting plate 14a, similarly to the mounting plate 14, branches off from the connecting part of the U-profile shape which interconnects the two legs. The connection to the supporting structure 11 is again effected by means of the mounting plate 14a. The adhesive layer 17a is again located between the support plate 15 and the structure reinforcement plate 10. Instead of the vertical adhesive layer 17b, an all-over adhesive layer 17c is located on the surface of the structure reinforcement plate 10 between this and the clamping plate 22. The connection of the structure reinforcement plate 10 to the mounting flange 13a is again effected by means of the two adhesive layers 17a and 17c. The two adhesive connections 17a and 17c are subject to essentially only a shear stress. This is the case in particular if a bolt or screw 18c is additionally provided, which in its effect corresponds to the screw 18a according to FIG. 4. For this purpose, the screw 18c is likewise preloaded with a spring element 19 and screwed into the support plate 15.

In order to avoid torques arising, it should be ensured that the adhesive gaps are each completely filled by an adhesive layer 17a, 17b or 17c.

Figure 6:
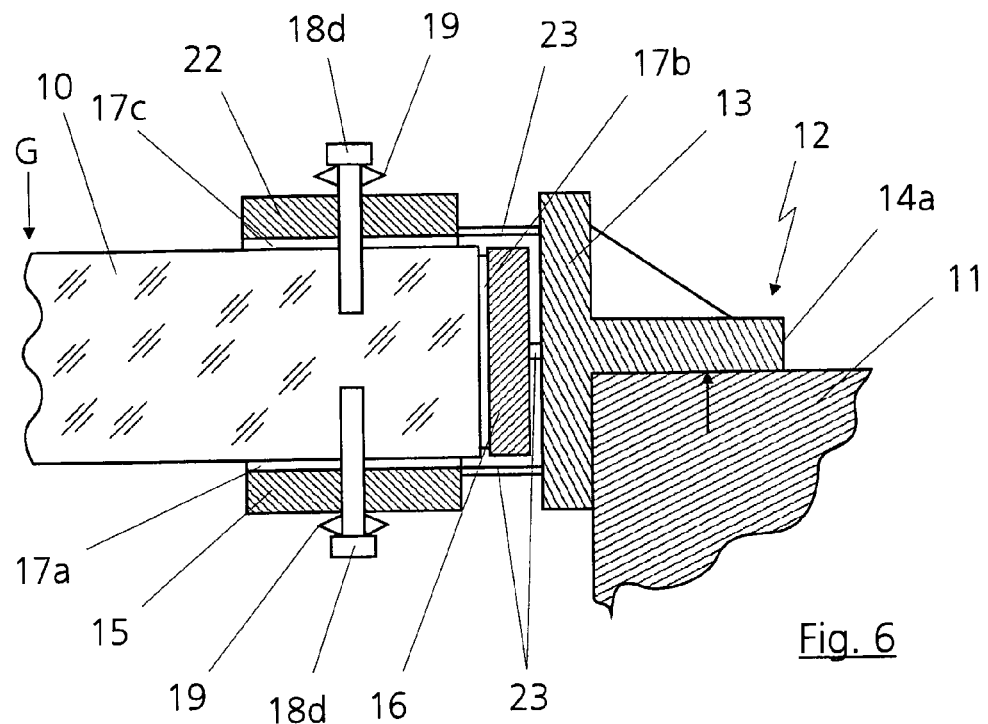
FIG. 6 shows an enlarged illustration of an attachment location with a supporting element in a third configuration.

FIG. 6 shows a configuration which essentially corresponds to the embodiment according to FIG. 4, although here the U-profile shape is "broken up". In this connection, as can be seen, the support plate 15 and the clamping plate 22 are not connected via a connecting plate or connecting part connected to the structure reinforcement plate 10, by means of the vertical adhesive layer 17b, on the outer peripheral wall of the structure reinforcement plate 10. Instead, a mounting flange 13 in a T-shape with a mounting plate 14 for connection to the supporting structure 11 is arranged on the side facing the supporting structure 11. The support plate 15, the clamping plate 22 and the peripheral plate 16 are each connected to the mounting flange 13 on the side facing the mounting flange 13 via an articulated arm 23. By means of the articulated arms 23, it is ensured that no torques are introduced into the adhesive surfaces 17a, 17b and 17c owing to the eccentric supporting forces, but only shear stresses, as the support plate 15, the clamping plate 22 and the peripheral plate 16 can adjust themselves positionally in relation to the mounting flange 13 connected firmly to the supporting structure 11.

The articulated arms 23 can be designed and connected to the support plate 15, the clamping plate 22, the peripheral plate 16 and the mounting flange 13 in any way. Advantageously, however, the parts mentioned above will all be made in one piece and from the same metal material.

In this case as well, screws 18d can be additionally provided, which have the same effect as the screw 18a in FIG. 4 and the screw 18c in FIG. 5. For the same purpose, spring elements 19 are also provided. One of the two screws 18d is passed through the upper clamping plate 22, while, on the opposite side, a screw 18d is passed through the support plate 15 from below. Both screws 18d are connected to the structure reinforcement plate 10 by means of threaded bores in it.

Figure 7:
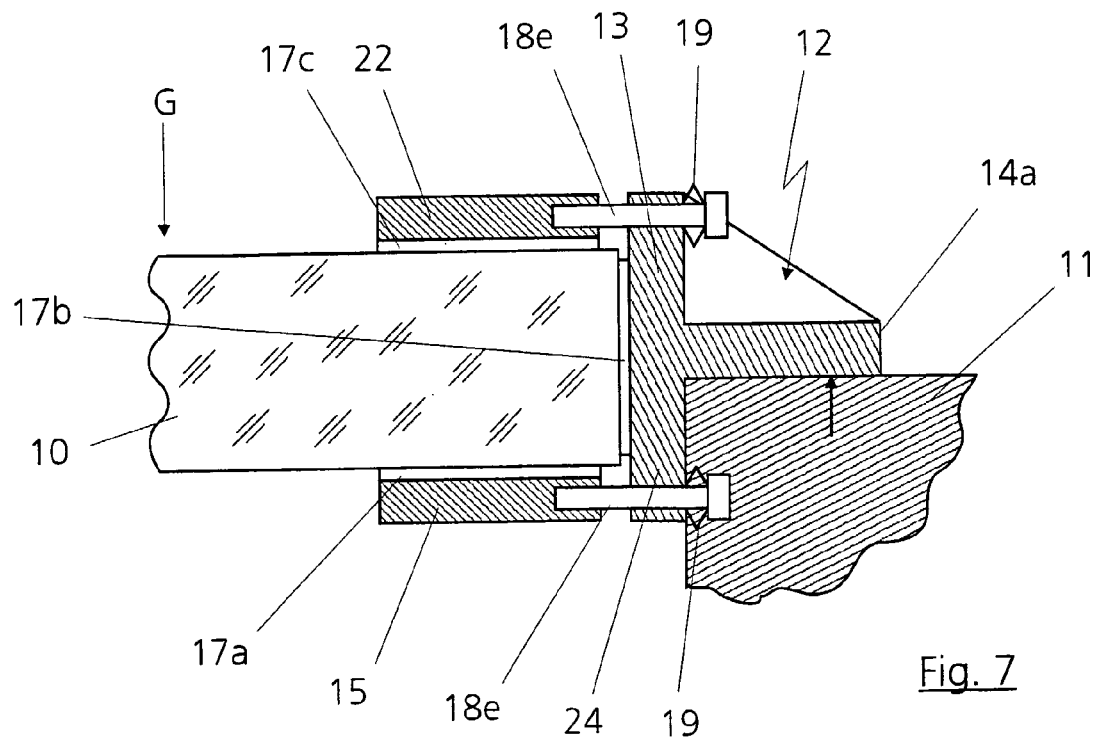
FIG. 7 shows an enlarged illustration of an attachment location with a supporting element in a fourth configuration.

FIG. 7 illustrates a similar configuration to the embodiment described with reference to FIG. 6, for which reason the same references have been kept for the same parts. Instead of articulated arms 23, however, screws 18e, which connect the support plate 15 and the clamping plate 22 to the mounting flange 13, are provided as connecting elements. In this case, there is no peripheral plate 16. In this case, the function of the peripheral plate 16 is taken over by a vertical T-leg 24 of the mounting flange 13 of T-shaped design. The horizontal part of the mounting flange 13 serves as the mounting plate 14a for connection to the supporting structure 11.

The two screws 18e are each prestressed in the same way by a spring element 19, passed through through-bores in the vertical T-leg 24 and screwed into threaded bores of the structure reinforcement plate 10. By means of the type of connection illustrated, a secure connection is brought about between the structure reinforcement plate 10 and the mounting flange 13, essentially only shear stresses arising in the adhesive surfaces 17a, 17b and 17c, and the stresses arising owing to the bearing forces being taken up via the two bolts or screws 18e.

The invention is generally suitable for connecting load-removing flanges to components made of brittle materials and with minimum introduction of stresses.

What is claimed is:

1. A structure for use in a projection exposure system of the type used for manufacturing semiconductors, said structure comprising:
   a projection lens assembly which includes a housing and a plurality of optical elements mounted in said housing for imaging a mask onto a semiconductor substrate, said housing having at least one structural element,
   a supporting structure for supporting said projection lens assembly and bearing the weight of said projection lens assembly, said weight of said projection lens assembly including at least the combined weight of said housing and said plurality of optical elements, and
   a plurality of supporting elements, each respective one of which forms part of a respective one of a plurality of connections through which said housing is connected to said supporting structure and through which said weight of said projection lens is transferred to said supporting structure in such a way that supporting forces generated by said supporting structure as a result of said transfer of said weight of said projection lens assembly are taken up by a pressure force and a shear force which act on at least one of said supporting elements.

2. A structure according to claim 1, wherein at least one of said supporting elements has a mounting flange and at least one of said connections comprises a layer of adhesive between said structural element and said mounting flange.

3. A structure according to claim 1, wherein said structural elements are made of materials to which the group comprising glass, ceramic and glass ceramic belongs.

4. A structure according to claim 1, wherein said supporting elements-comprise a metal supporting element.

5. A structure according to claim 1, wherein said plurality of supporting elements comprises at least three supporting elements, distributed about the periphery of said structural element.

6. A structure according to claim 5, wherein said housing comprises an at least approximately centrally arranged structure reinforcing plate.

7. A structure according to claim 1, wherein said supporting elements each have an at least approximately an L-shaped portion and an adjoining mounting flange.

8. A structure according to claim 7, wherein said L-shaped portion has a horizontal leg and a vertical leg and wherein said structural element is supported upon said horizontal leg of said L-shaped portion and said vertical leg of said L-shaped portion lies facing the external periphery of said structural element, said mounting flange adjoining said vertical leg of the L-shape in at least approximately the horizontal direction.

9. A structure according to claim 8, wherein adhesive surfaces are arranged between said structural element and said vertical leg of said supporting element and between said structural element and said horizontal leg of said supporting element.

10. A structure according to claim 7, wherein said structural element is provided with a through-bore through which a prestressed screw is passed and connected to the horizontal leg of the L-shape.

11. A structure according to claim 7, wherein said structural element is provided with a through-bore through which a prestressed screw passes and connects said vertical leg to said structural element.

12. A structure according to claim 1, wherein said supporting elements each have a portion of substantially U-shaped cross section, from which said mounting flange branches off, said substantially U-shaped portion having two mutually spaced legs between which said structural element is received.

13. A structure according to claim 12, wherein said substantially U-shaped portion of said structural element is provided with a through-bore, through which a screw is passed, said screw being connected to said two legs of said supporting element in such a way that said two legs exert a prestressing force on said structural element.

14. A structure according to claim 1, wherein said supporting element comprises two mutually spaced clamping plates between which said structural element is received, a peripheral plate running parallel to an outer wall of said structural element, and a mounting flange connected to said two clamping plates and said peripheral plate.

15. A structure according to claim 14, wherein said mounting flange has a portion having an at least approximately T-shaped cross section and has connecting elements connecting said two clamping plates and said peripheral plate to said mounting flange, said at least approximately T-shaped portion having a first leg which serves as a mounting plate for mounting said mounting flange upon said supporting structure and also has a second leg oriented perpendicular to said first leg, said connecting element being connected to said second leg of said at least approximately T-shaped portion.

16. A structure according to claim 15, wherein said connecting elements comprise screws and spring elements placing said screws under prestress.

17. A structure according to claim 14, further comprising at least one adhesive layer disposed between each of said clamping plates and said structural element and between said peripheral plates and said structural element.

18. A structure according to claim 17, wherein said two clamping plates are provided with screws, which are screwed into said structural element in such a way that a prestress is exerted on said at least one adhesive layer.

* * * * *

UNITED STATES PATENT AND TRADEMARK OFFICE
CERTIFICATE OF CORRECTION

PATENT NO. : 7,692,881 B2
APPLICATION NO. : 10/597872
DATED : April 6, 2010
INVENTOR(S) : Kwan et al.

It is certified that error appears in the above-identified patent and that said Letters Patent is hereby corrected as shown below:

Column 1, line 38
 change "structure, On" and insert --structure. On--

Column 5, line 15
 change "passed tlirough" and insert --passed through--

Column 5, line 58
 change "elements-comprise" and insert --elements comprise--

Column 6, line 2
 change "approximately an L-shaped" and insert --approximately L-shaped--

Signed and Sealed this

Seventeenth Day of August, 2010

David J. Kappos
*Director of the United States Patent and Trademark Office*